(12) United States Patent
Bae et al.

(10) Patent No.: US 9,524,678 B2
(45) Date of Patent: Dec. 20, 2016

(54) ORGANIC LIGHT EMITTING DIODE DISPLAY DEVICE AND METHOD FOR DRIVING THE SAME

(71) Applicant: LG Display Co., Ltd., Seoul (KR)

(72) Inventors: Nayoung Bae, Busan (KR); Jongsik Shim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 52 days.

(21) Appl. No.: 14/508,882

(22) Filed: Oct. 7, 2014

(65) Prior Publication Data

US 2015/0187271 A1 Jul. 2, 2015

(30) Foreign Application Priority Data

Dec. 31, 2013 (KR) .................. 10-2013-0169165

(51) Int. Cl.
*G09G 3/32* (2016.01)
*H01L 27/146* (2006.01)

(52) U.S. Cl.
CPC .......... *G09G 3/3291* (2013.01); *G09G 3/3233* (2013.01); *H01L 27/1463* (2013.01); *H01L 27/14609* (2013.01); *H01L 27/14612* (2013.01); *H01L 27/14623* (2013.01); *H01L 27/14627* (2013.01); *G09G 2300/0866* (2013.01); *G09G 2320/0233* (2013.01); *G09G 2320/0295* (2013.01); *G09G 2320/043* (2013.01)

(58) Field of Classification Search
CPC .......... H01L 27/14623; H01L 27/1463; H01L 27/14627; H01L 27/14643; H01L 27/14609; H01L 27/14612
See application file for complete search history.

(56) References Cited

U.S. PATENT DOCUMENTS

| 2008/0048951 | A1* | 2/2008 | Naugler, Jr. | ........... | G09G 3/006 345/82 |
| 2010/0188320 | A1* | 7/2010 | Min | ..................... | G09G 3/3291 345/80 |
| 2011/0164071 | A1* | 7/2011 | Chung | .................. | G09G 3/3208 345/690 |
| 2014/0132583 | A1* | 5/2014 | Kim | ..................... | G09G 3/3233 345/212 |
| 2015/0130785 | A1* | 5/2015 | Shin | ..................... | G09G 3/3233 345/213 |

\* cited by examiner

*Primary Examiner* — Marc Armand
*Assistant Examiner* — Quinton Brasfield
(74) *Attorney, Agent, or Firm* — Fenwick & West LLP

(57) ABSTRACT

An organic light emitting diode display device includes: an organic light emitting diode; a driving transistor having a first electrode, a second electrode, and a third electrode, the first electrode coupled to the variable driving voltage source and controlling the operation of the organic light emitting diode depending on a voltage difference between the third electrode and the second electrode; a first current source for supplying a first current to the third electrode and the second electrode of the driving transistor through a data line; a second current source for supplying a second current to the third electrode and the second electrode of the driving transistor through the data line; and a digital-to-analog converter for detecting the level of a sensing current flowing between the first and second electrodes of the driving transistor through the data line.

7 Claims, 4 Drawing Sheets

ORGANIC LIGHT EMITTING DIODE DISPLAY DEVICE AND METHOD FOR DRIVING THE SAME

This application claims the priority benefit of Korean Patent Application No. 10-2013-0169165 filed on Dec. 31, 2013, which is incorporated herein by reference for all purposes as if fully set forth herein.

BACKGROUND OF THE INVENTION

1. Field of the Invention

The present invention relates to an organic light emitting diode display device and a method for driving the same.

2. Discussion of the Related Art

Flat panel display (FPD) devices are advantageous for miniaturization and weight reduction thereof, and thus have been widely used for monitors of desktop computers as well as portable computers such as laptop computer and PDA, mobile cellular phones, and the like. These FPD devices include liquid crystal display (LCD) devices, plasma display panel (PDP) devices, field emission display (FED) devices, and organic light emitting diode (OLED) display devices.

Of these, the OLED display devices have advantages of a fast response speed, a luminance with high luminous efficiency, and a large viewing angle. Generally, as for the OLED display device, a data voltage is applied to a gate electrode of a driving transistor by using a switch transistor turned on by a scan signal, and an organic light emitting diode emits a light by using the data voltage supplied to the driving transistor. That is, the current supplied to the organic light emitting diode is controlled by the data voltage applied to the gate electrode of the driving transistor. However, respective driving transistors formed in pixels have a deviation of the threshold voltage (Vth) due to characteristics of the manufacturing process. The current supplied to the organic light emitting diode may have a level different from a designed level due to the deviation of the threshold voltage among the driving transistors, and thus the level of the luminance may be different from a desired level.

To solve this problem, a method of compensating picture quality has been employed in which the non-uniformity of luminance is reduced by sensing characteristic parameters (threshold voltage and mobility) of driving transistors for respective pixels and then appropriately correcting input data depending on the sensing results.

For example, according to the external compensation method disclosed in Korean Patent Publication No. 10-2013-0036659 (titled "Method of Measuring Characteristics of Transistor in Organic Light Emitting Diode Display Device"), a current source is positioned out of pixels, a predetermined current is applied to organic light emitting diodes through the current source, the resultant voltages are measured, and the deviation of the degradation among the organic light emitting diodes is compensated.

As for the widely known techniques for compensating picture quality, a slow mode sensing method and a past mode sensing mode are respectively employed in order to detect threshold voltage characteristics and mobility characteristics of driving transistors. In addition, the respective sensing methods adopt different manners and require an additional memory for storing offset values.

Therefore, new approaches for more efficiently detecting threshold voltage characteristics and mobility characteristics of driving transistors have been sought.

SUMMARY OF THE INVENTION

The present invention has been made in an effort to provide an organic light emitting diode display device capable of detecting and compensating both threshold voltage characteristics and mobility characteristics while decreasing a sensing period.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. It is noted that detailed description of known arts will be omitted if it is determined that the arts can mislead the embodiments of the invention.

Figure 1:
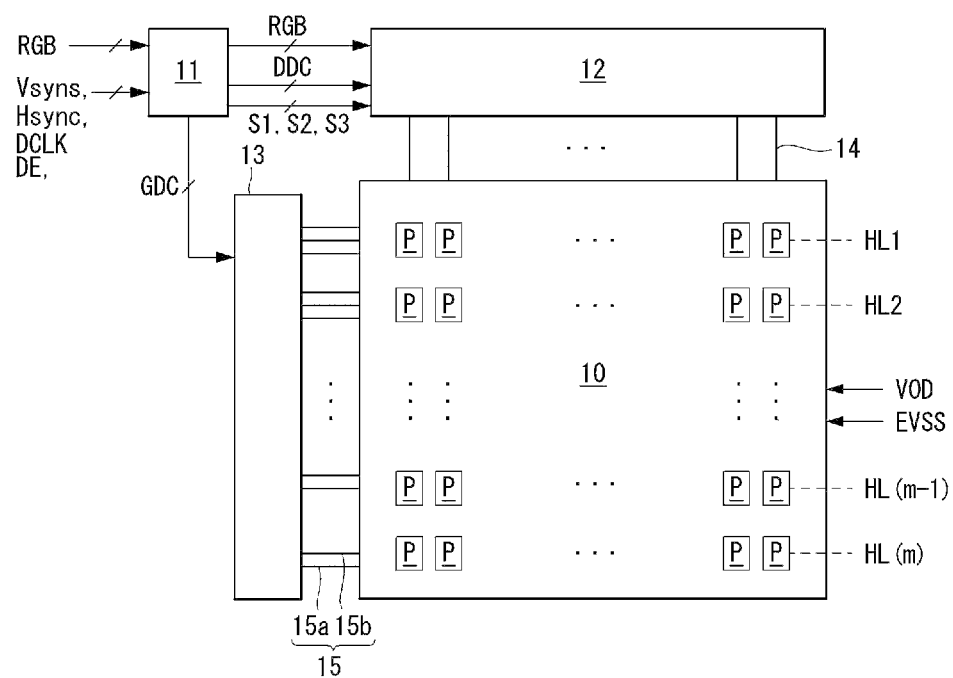
FIG. 1 is a diagram showing an organic light emitting diode display device according to the present invention.
Figure 2:
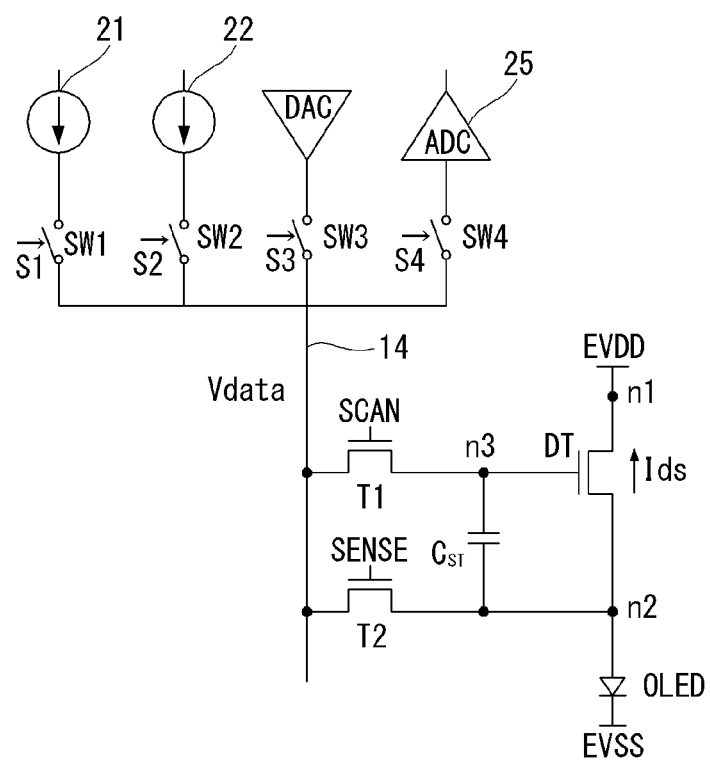
FIG. 2 is a diagram showing a pixel of an organic light emitting diode display device according to the present invention.

FIG. 1 is a diagram showing an organic light emitting diode display device according to one embodiment; and FIG. 2 is a diagram showing an example of a pixel P shown in FIG. 1.

Referring to FIGS. 1 and 2, an organic light emitting diode display device according to one embodiment includes a display panel 10 having pixels P arranged in a matrix type, a data driver 12, a gate driver 13, and a timing controller 11.

The display panel 10 includes a plurality of pixels P. The display panel 10 displays images based on gray scales displayed by the respective pixels P. The plurality of pixels P are arranged at predetermined intervals for first to m-th horizontal lines such that the pixels P are disposed in a matrix.

The respective pixels P are disposed at crossing regions of data lines 14 and gate line parts 15 which are orthogonal to each other. Each of the gate line parts 15 connected to the respective pixels P includes a scan line 15a and a sense line 15b. Each of the pixels P includes an organic light emitting diode OLED, a driving transistor DT, first and second transistors T1 and T2, and a storage capacitor Cst. The driving transistor DT and the first and second transistors T1 and T2 may be realized by an oxide thin film transistor (hereinafter, TFT) including an oxide semiconductor layer. The oxide TFT is favorable for increasing the display panel 10 in consideration of factors including electron mobility, process variations, and the like. However, the present invention is not limited thereto, and the semiconductor layer of the TFT may be formed of amorphous silicon, polycrystalline silicon, or the like.

The timing controller 11 controls the driving timing of the data driver 12 and the gate driver 13. To this end, the timing controller 11 rearranges externally input digital video data (RGB) in accordance with the resolution of the display panel 10 and then supplies the data to the data driver 12. In addition, the timing controller 11 generates a data control signal DDC for controlling the operation timing of the data driver 12 and a gate control signal GDC for controlling the operation timing of the gate driver 13, based on timing signals, such as a vertical synchronization signal (Vsync), a horizontal synchronization signal (Hsync), a dot clock signal (DCLK), and a data enable signal DE.

The data driver 12 drives the data lines 14. To this end, the data driver 12 converts the digital video data RGB input from the timing controller 11 into an analog data voltage, based on the data control signal DDC, and supplies the analog data voltage to the data lines 14.

The data driver 12 includes first and second current sources 21 and 22 and an analog-to-digital converter (hereinafter, ADC) 25. The first current source 21 supplies a first current to a third electrode and a second electrode of the driving transistor DT, and the second current source 22 supplies a second current to the third electrode and the second electrode of the driving transistor DT. The ADC 25, when receiving the first current, senses the level of a current flowing from the second electrode to a first electrode of the driving transistor DT. In addition, the ADC 25, when receiving the second current, senses the level of a current flowing from the second electrode to the first electrode of the driving transistor DT.

The gate driver 13 drives the gate line parts 15, and generates first to third gate signals by using the gate control signal GDC supplied from the timing controller 11. The gate control signal GDC includes a gate start pulse GSP for indicating a start scan line from which the scan starts, a gate shift clock GSC for sequentially shifting the gate start pulse GSP, and a gate output enable GOE for indicating the output of the gate driver.

Each of the pixels P according to an embodiment of the present invention includes an organic light emitting diode OLED, a variable driving voltage source E_VDD, a driving transistor DT, first and second transistors T1 and T2, and a storage capacitor Cst.

The organic light emitting diode OLED emits a light by a driving current supplied from the driving transistor DT. Multiple organic compound layers are formed between an anode electrode and a cathode electrode in the organic light emitting diode OLED. The organic compound layers include a hole injection layer HIL, a hole transport layer HTL, an emission layer EML, an electron transport layer ETL, and an electron injection layer EIL. The anode electrode of the organic light emitting diode OLED is connected to a source electrode of the driving transistor DT, and a cathode electrode thereof is connected to a low-voltage driving voltage VSS.

The variable driving voltage source E_VDD supplies a low-level voltage and a high-level voltage selectively.

The driving current applied to the organic light emitting diode OLED is controlled by a voltage between a first electrode n1 and a second electrode n2 of the driving transistor DT. Here, the first and second electrodes n1 and n2 may be a drain (source) and a source (drain) electrode, respectively. Since the first electrode n1 of the driving transistor DT is connected to the variable driving voltage source E_VDD, the first electrode n1 may be a drain electrode or a source electrode depending on the voltage level of the variable driving voltage source. Similarly, the second electrode n2 of the driving transistor DT may be a source electrode or a drain electrode depending on the voltage level of the variable driving voltage source E_VDD.

The third electrode n3 of the driving transistor DT is coupled to an input terminal of the data voltage Vdata; the first electrode n1 thereof is connected to an input terminal of the variable driving voltage E_VDD; and the second electrode n2 thereof is connected to the organic light emitting diode OLED.

The first transistor T1 controls the current path between the data line 14 and the third electrode n3 of the driving transistor DT in response to the scan signal SCAN. To this end, a third electrode of the first transistor T1 is connected to the scan line 15a; a drain electrode thereof is connected to the data line 14; and a source electrode thereof is connected to the third electrode n3 of the driving transistor DT.

The second transistor T2 controls the current path between the data line 14 and the second electrode n2 of the driving transistor DT in response to the sense signal SENSE. To this end, a third electrode of the second transistor T2 is connected to the sense line 15b; a drain electrode thereof is connected to the data line 14; and a source electrode thereof is connected to the second electrode n2 of the driving transistor DT.

The storage capacitor Cs maintains the data voltage Vdata supplied from the data line 14 during one frame, so that the driving transistor DT maintains a predetermined voltage. To this end, the storage capacitor Cst is connected to the third electrode n3 and the second electrode n2 of the driving transistor DT.

A method for detecting characteristics of the driving transistor DT formed in the pixel P having the foregoing structure is described as follows.

Figure 3:
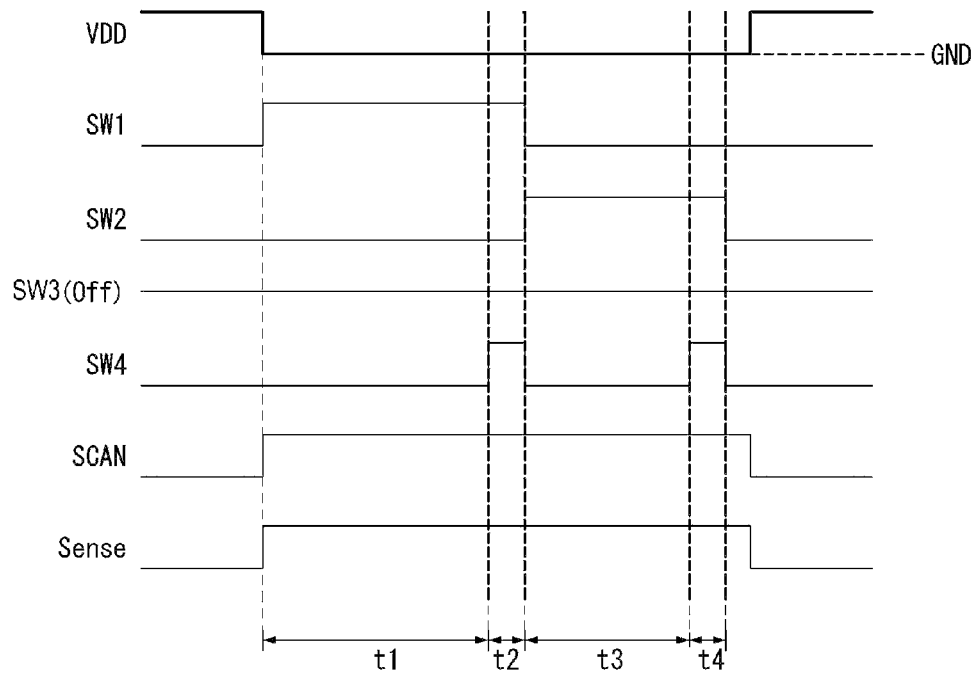
FIG. 3 is a timing diagram of waveforms for detecting threshold voltage characteristics and mobility characteristics of a driving transistor.

FIG. 3 is a timing diagram of waveforms supplied to the first transistor T1 and the second transistor T2 according to one embodiment.

During a first current supply period t1, the first switch SW1 supplies a first current Idc1 to the data line 14 in response to a high-level signal. The first transistor T1 supplies the first current Idc1, which is received through the data line 14, to the third electrode n3 of the driving transistor DT in response to the scan signal SCAN. The second transistor T2 supplies the first current Idc1, which is received through the data line 14, to the second electrode n2 of the driving transistor DT in response to the sense signal SENSE. In addition, the variable driving voltage source E_VDD is changed into a low-level voltage GND.

Accordingly, the voltage between the third electrode n3 and the second electrode n2 of the driving transistor DT is higher than the operation voltage, and the first sensing current Ids1 flows between the second electrode n2 and the first electrode n1. Here, the level of the first sensing current Ids1 is equal to the level of the first current Idc1.

During a first sensing period t2, the fourth switch SW4 is turned-on, and the ADC 25 obtains the voltage of the third electrode n3 of the driving transistor DT.

Figure 4:
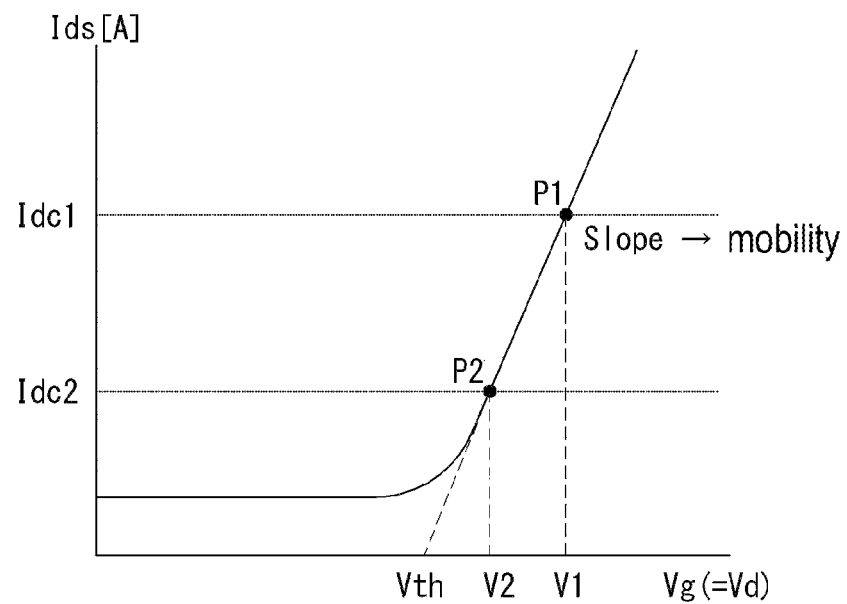
FIG. 4 is a view for illustrating a principle of detecting threshold voltage characteristics and mobility characteristic of a driving transistor.

Since the level of the first sensing current Ids is equal to the level of the first current Idc1, the first current Idc1 and the first sensing voltage V1 of the third electrode n3, which is obtained during the first sensing period t2, may be matched on the current characteristic curve of the driving transistor DT, which is shown in FIG. 4. That is, a first coordinate P1 is obtained by using the level of the first current Idc1 and the first sensing voltage V1.

During a second current supply period t3, the first switch SW1 is tuned off, and the second switch SW2 supplies a second current Idc2 to the data line 14 in response to a high-level signal. The first transistor T1 supplies the second current Idc2, which is received through the data line 14, to the third electrode n3 of the driving transistor DT in response to the scan signal SCAN. The second transistor T2 supplies the second current Idc2, which is received through the data line 14, to the second electrode n2 of the driving transistor DT in response to the sense signal SENSE. In addition, the variable driving voltage source E_VDD maintains the low-level voltage GND.

Accordingly, the voltage between the third electrode n3 and the second electrode n2 of the driving transistor DT is higher than the operation voltage, and the second sensing current Ids flows between the second electrode n2 and the first electrode n1. Here, the level of the second sensing current Ids2 is equal to the level of the second current Idc2.

During the second current supply period t3, the fourth switch SW4 is turned off.

During a second sensing period t4, the fourth switch SW4 is turned-on, and the ADC 25 obtains the voltage of the third electrode n3 of the driving transistor DT.

Since the level of the second sensing current Ids2 is equal to the level of the second current Idc2, the second current Idc2 and the second sensing voltage V2 of the third electrode n3, which is obtained during the second sensing period t4, may be matched on the current characteristic curve of the driving transistor DT, which is shown in FIG. 4. That is, a second coordinate P2 is obtained by using the level of the second current Idc2 and the second sensing voltage V2.

Eventually, the first coordinate P1 and the second coordinate P2 become two points on the current characteristic curve of the driving transistor DT.

The current characteristic curve of the driving transistor is shown as follows (Equation 1):

$$Ids = k \times \mu \times (Vgs - Vth) \quad \text{(Equation 1)}$$

Here, k is a proportional constant, μ is mobility, and Vth is a threshold voltage.

That is, the threshold voltage of the driving transistor may be obtained from (Equation 1) by calculating the x-intercept with respect to the straight line connecting the first coordinate P1 and the second coordinate P2. In addition, the mobility may be obtained by using the slope of the first coordinate P1 or the second coordinate P2.

Here, since the current characteristic curve of the driving transistor is not substantially a straight line between the first and second coordinates P1 and P2, the X-intercept of the curve connecting the first and second coordinates P1 and P2 may be different from the absolute value of the driving transistor.

Accordingly, in one embodiment, the compensation of the threshold voltage can be performed by calculating two or more threshold voltage levels of the driving transistor and conducting relative comparison therebetween. That is, the relative difference value of threshold voltage may be calculated by using the difference in Vg value. In addition, the relative proportional value of mobility may be obtained by calculating the proportion of the slope.

Figure 5:
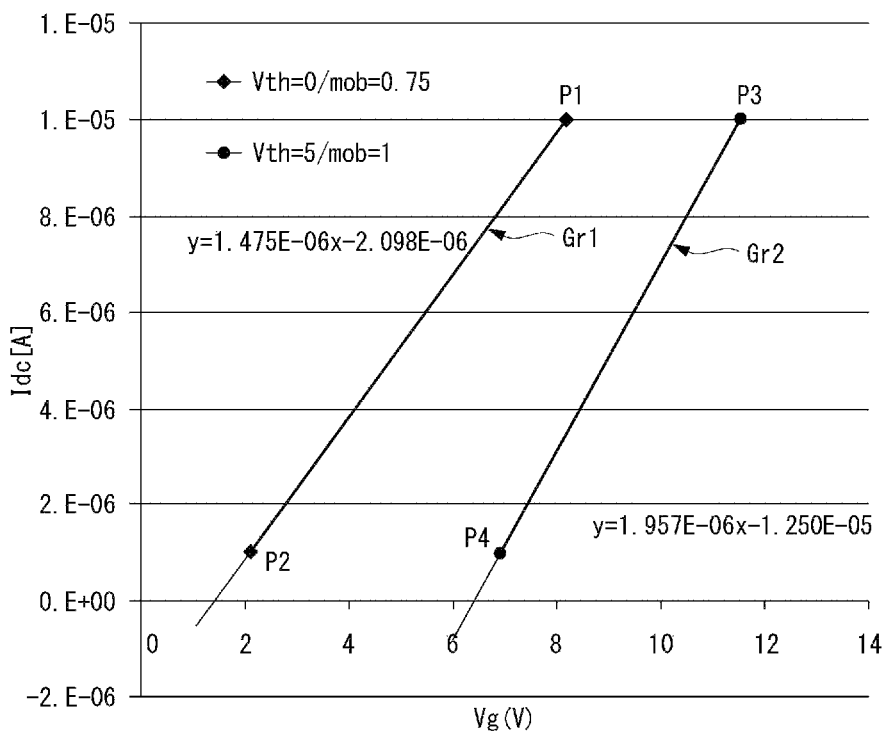
FIG. 5 is a view for illustrating comparison of threshold voltage and mobility between pixels.

FIG. 5 shows simulation results in which characteristics of first and second driving transistors formed in two pixels are sensed. With respect to substantial specification of devices used in the simulation, the threshold voltage (Vth) is 0 V and the mobility is 0.75 for the first driving transistor, and the threshold voltage (Vth) is 5 V and the mobility is 1 for the second driving transistor.

A first graph (Gr1) shows characteristics of the first driving transistor, which are calculated by using the present invention. A first coordinate P1 corresponds to a voltage of the third electrode when 10 μA of current is applied to the first driving transistor DT, and a second coordinate P2 corresponds to a voltage of the third electrode when 1 μA of current is applied to the first driving transistor DT.

A second graph (Gr2) shows characteristics of the second driving transistor, which are calculated by using various embodiments described herein. A third coordinate P3 corresponds to a voltage of the third electrode when 10 μA of current is applied to the second driving transistor DT, and a fourth coordinate P4 corresponds to a voltage of the third electrode when 1 μA of current is applied to the second driving transistor DT.

[Table 1] shows threshold voltage values and mobility values of the first and second driving transistors obtained by using the method of various embodiments.

TABLE 1

|  | Threshold voltage (X- | Mobility |
|---|---|---|
| First driving | 1.4 | 1.5 |
| Second driving | 6.4 | 2.0 |

Based on the results, the difference value of threshold voltage (ΔVth) and the proportional value of mobility (Δmobility) of the second driving transistor as compared with the first driving transistor are calculated by Equation 2 and Equation 3 below:

$$\Delta Vth = 6.4 - 1.4 = 5 \quad \text{(Equation 2)}$$

$$\Delta\text{mobility} = 1.5/2.0 = 1.3 \quad \text{(Equation 3)}$$

It can be verified that the above results are mostly similar to the difference value of threshold voltage (5−0=0) and the proportional value of mobility (1/0.75), which are calculated based on specifications of substantial devices.

Further, in the present invention, the data voltage can be compensated by using the thus obtained difference value of threshold voltage (ΔVth) and proportional value of mobility (Δmobility).

According to the organic light emitting diode display device of various embodiments, the time for the procedure for detecting threshold voltage characteristics and mobility characteristics of the driving transistor can be reduced. The source follow method for detecting the threshold voltage according to the prior art requires a long time for sensing. However, according to various embodiments described herein, both the threshold voltage and mobility can be detected for a short time such as several tens of microseconds or smaller.

Figure 6:
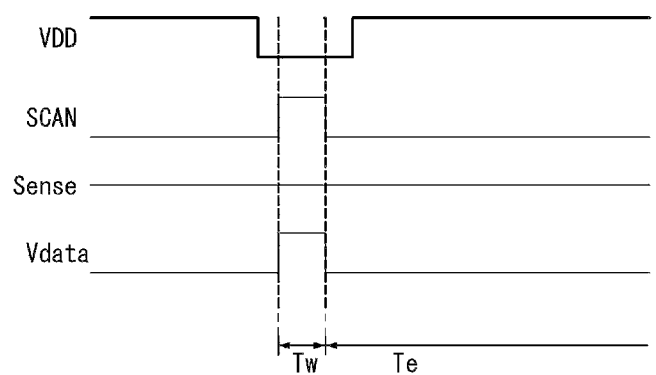
FIG. 6 is a timing diagram of waveforms for normal driving.

FIG. 6 is a timing diagram of waveforms for normal driving of an organic light emitting diode of the present invention.

Referring to FIG. 6, during a writing period (Tw), the variable driving voltage source E_VDD swings to a low voltage. The first transistor T1 supplies the data voltage Vdata, which is received from the data line 14, to the third electrode of the driving transistor DT in response to the scan signal SCAN of the first transistor T1. Here, the voltage of the second electrode n2 in a floating state rises or falls by charges charged in the storage capacitor Cst.

During an emission period Te, the variable driving voltage source E_VDD supplies a high-level voltage to the first electrode n1. The first transistor T1 is turned off, and the data voltage stored in the storage capacitor Cst is supplied to the organic light emitting diode OLED. Accordingly, the organic light emitting diode OLED emits a light with a luminance proportional to the data voltage.

The organic light emitting diode display device according to various embodiments can simultaneously detect the threshold voltage and mobility of the driving transistor while not using the source follow type.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting diode display device, comprising:
    an organic light emitting diode;
    a variable driving voltage source;
    a driving transistor having a first electrode, a second electrode, and a third electrode, the first electrode coupled to the variable driving voltage source and controlling the operation of the organic light emitting diode depending on a voltage difference between the third electrode and the second electrode with a first predetermined voltage applied to the first electrode by the variable driving voltage source;
    a first current source for supplying a first current to the third electrode and the second electrode of the driving transistor through a data line with a second predetermined voltage applied to the first electrode by the variable driving voltage source, such that current flows from the second electrode to the first electrode through the driving transistor towards the variable driving voltage source while the first current is supplied to the third electrode and the second electrode of the driving transistor;
    a second current source for supplying a second current to the third electrode and the second electrode of the driving transistor through the data line with a second predetermined voltage applied to the first electrode by the variable driving voltage source, such that current flows from the second electrode to the first electrode through the driving transistor towards the variable driving voltage source while the second current is supplied to the third electrode and the second electrode of the driving transistor; and
    a analog-to-digital converter for detecting the level of a voltage at the third electrode in response to the current flowing from the second electrode to the first electrode of the driving transistor through the data line.

2. The organic light emitting diode display device of claim 1, further comprising:
    a first transistor coupled between the data line and the third electrode of the driving transistor and switching a current path between the data line and the third electrode of the driving transistor; and
    a second transistor coupled between the data line and the second electrode of the driving transistor and switching a current path between the data line and the second electrode.

3. A method for driving an organic light emitting diode display device that includes: a driving transistor having a first electrode, a second electrode, and a third electrode, the first electrode coupled to a variable driving voltage source and controlling the operation of the organic light emitting diode depending on a voltage difference between the third electrode and the second electrode with a first predetermined voltage applied to the first electrode by the variable driving voltage source; a first current source for supplying a first current to the third electrode and the second electrode of the driving transistor through a data line; and a second current source for supplying a second current to the third electrode and the second electrode of the driving transistor through the data line, the method comprising:
    obtaining a first sensing voltage by supplying the first current to the third electrode and the second electrode and detecting the voltage of the third electrode corresponding to the first current, the first current supplied to the third electrode and the second electrode with a second predetermined voltage applied to the first electrode by the variable driving voltage source, such that current flows from the second electrode to the first electrode through the driving transistor towards the variable driving voltage source while the first current is supplied to the third electrode and the second electrode of the driving transistor;
    obtaining a second sensing voltage by supplying the second current to the third electrode and the second electrode and detecting the voltage of the third electrode corresponding to the second current, the second current supplied to the third electrode and the second electrode with the second predetermined voltage applied to the first electrode by the variable driving voltage source, such that current flows from the second electrode to the first electrode through the driving transistor towards the variable driving voltage source while the second current is supplied to the third electrode and the second electrode of the driving transistor;
    obtaining a first coordinate corresponding to the first current and the first sensing voltage;
    obtaining a second coordinate corresponding to the second current and the second sensing voltage; and
    obtaining a linear fit between the first and second coordinates as a characteristic curve of the driving transistor.

4. The method of claim 3, further comprising calculating an X-intercept of the characteristic curve as a threshold voltage of the driving transistor.

5. The method of claim 4, further comprising calculating a slope of the characteristic curve as a mobility of the driving transistor.

6. The method of claim 4, further comprising:
    calculating a threshold voltage of a driving transistor of a first pixel of the organic light emitting diode display device;
    calculating a threshold voltage of a driving transistor of a second pixel of the organic light emitting diode display device; and
    calculating a difference between the threshold voltage of the driving transistor of the first pixel and the threshold voltage of the driving transistor of the second pixel to compensate for a deviation of threshold voltage.

7. The method of claim 5, further comprising:
calculating a mobility of a driving transistor of a first pixel of the organic light emitting diode display device;
calculating a mobility of a driving transistor of a second pixel of the organic light emitting diode display device; and
calculating a ratio between the mobility of the driving transistor of the first pixel and the mobility of the driving transistor of the second pixel to compensate for a deviation of mobility.

* * * * *